United States Patent
Yin et al.

(10) Patent No.: US 12,021,133 B2
(45) Date of Patent: *Jun. 25, 2024

(54) INNER SPACER LINER

(71) Applicant: Taiwan Semiconductor Manufacturing Company, Ltd., Hsinchu (TW)

(72) Inventors: Jin-Mu Yin, Kaohsiung (TW); Wei-Yang Lee, Taipei (TW); Chih-Hao Yu, Tainan (TW); Yen-Ting Chen, Hsinchu (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/869,028

(22) Filed: Jul. 20, 2022

(65) Prior Publication Data

US 2022/0352350 A1  Nov. 3, 2022

Related U.S. Application Data

(63) Continuation of application No. 17/097,711, filed on Nov. 13, 2020, now Pat. No. 11,444,178.

(51) Int. Cl.
| | |
|---|---|
| H01L 29/66 | (2006.01) |
| H01L 29/423 | (2006.01) |
| H01L 29/78 | (2006.01) |
| H01L 29/786 | (2006.01) |

(52) U.S. Cl.
CPC .. *H01L 29/66553* (2013.01); *H01L 29/42392* (2013.01); *H01L 29/66795* (2013.01); *H01L 29/785* (2013.01); *H01L 29/78696* (2013.01)

(58) Field of Classification Search
CPC ............. H01L 29/785; H01L 29/42392; H01L 29/66553; H01L 29/78696; H01L 29/6656; H01L 29/0673; H01L 29/66795; H01L 29/0684; H01L 29/7848; H01L 29/7853; H01L 29/0665
See application file for complete search history.

(56) References Cited

U.S. PATENT DOCUMENTS

| | | |
|---|---|---|
| 1,003,267 A | 9/1911 | Wilson |
| 9,818,872 B2 | 11/2017 | Ching |
| 9,887,269 B2 | 2/2018 | Ching |
| 9,899,398 B1 | 2/2018 | Colinge |
| 10,109,721 B2 | 10/2018 | Lin |
| 10,157,799 B2 | 12/2018 | Ching |
| 10,199,502 B2 | 2/2019 | Huang |

(Continued)

*Primary Examiner* — Changhyun Yi
(74) *Attorney, Agent, or Firm* — Haynes and Boone, LLP

(57) ABSTRACT

The present disclosure provides a semiconductor device and a method of forming the same. A semiconductor device according to the present disclosure includes a first source/drain feature and a second source/drain feature over a substrate, a plurality of channel members extending between the first source/drain feature and the second source/drain feature, a plurality of inner spacer features interleaving the plurality of channel members, a gate structure wrapping around each of the plurality of channel members, and a semiconductor liner sandwiched between the gate structure and each of the plurality of inner spacer features.

20 Claims, 20 Drawing Sheets

(56) References Cited

U.S. PATENT DOCUMENTS

| | | |
|---|---|---|
| 10,290,546 B2 | 5/2019 | Chiang |
| 10,475,902 B2 | 11/2019 | Lee |
| 11,444,178 B2* | 9/2022 | Yin ........................ H01L 29/775 |
| 2018/0175036 A1 | 6/2018 | Ching |
| 2019/0157444 A1* | 5/2019 | Yang ............... H01L 21/823431 |
| 2019/0198616 A1* | 6/2019 | Coquand ........... H01L 29/41725 |
| 2020/0266060 A1* | 8/2020 | Cheng ................. H01L 29/0673 |
| 2020/0395445 A1* | 12/2020 | Choi ................... H01L 29/1079 |
| 2021/0351275 A1* | 11/2021 | Wostyn ............. H01L 29/66545 |

* cited by examiner

INNER SPACER LINER

PRIORITY DATA

This application is a continuation of U.S. patent application Ser. No. 17/097,711, filed Nov. 13, 2020, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

To improve performance of an MBC transistor, efforts are invested to develop epitaxial source/drain features that stain channels and provide reduced resistance. Epitaxial source/drain features for an MBC transistor are not deposited on a continuous semiconductor service and may contain defects. While conventional epitaxial features are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
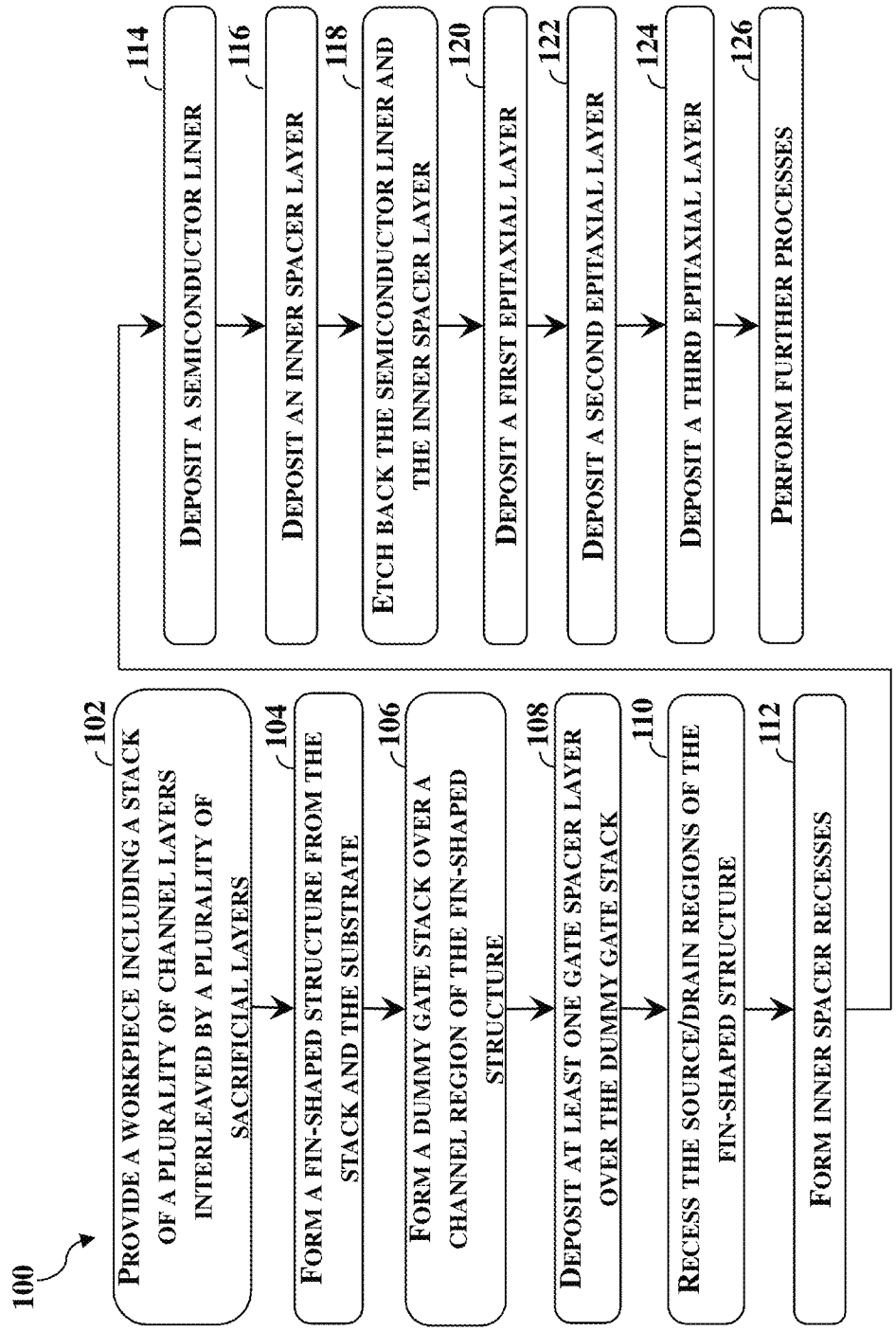
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to an inner spacer liner of MBC transistors. Channel regions of an MBC transistor may include a vertical stack of channel members that, depending on their shapes, may be referred to as nanowires, nanosheets, nanostructures. The vertical stack of channel members are formed from channel layers interleaved by sacrificial layers. A channel release process of the MBC transistor fabrication process selectively removes the sacrificial layers to release the channel layers as channel members. To facilitate the channel release process and to protect the epitaxial source/drain features, inner spacer recesses are formed by partially and selectively recessing the sacrificial layers and fill by inner spacer features. During the channel release process, the inner spacer features serve as a barrier between the etchant and the epitaxial source/drain features. The implementation of inner spacer features is not without its challenges. The etching of the inner spacer recesses may not be perfectly selective to the sacrificial layer and may also trim the channel layers, thereby reducing the contact area between the channel members and the source/drain features. The trimming of the channel layers may enlarge the inner spacer recesses, causing dishing profiles in the inner spacer features and defects of the source/drain features. Additionally, inner spacer features may not sufficiently withstand the channel release process. When that happens, the gate structure may be shorted to the source/drain features.

The present disclosure provides embodiments of a semiconductor device where a semiconductor liner is deposited over the inner spacer recesses before the inner spacer layer is deposited. The semiconductor liner may be formed silicon. The semiconductor liner provides several advantages to meet the challenges ordinarily associated with inner spacer features. For example, the semiconductor liner may help make up for the loss of the channel layers due to formation of the inner spacer recesses and increase the semiconductor surfaces for epitaxial source/drain feature deposition. The semiconductor liner also increases the contact area between the source/drain feature and the channel members. The semiconductor layer also provides additional protection to the source/drain features during the channel release process.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-20, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 as the context requires. For avoidance, the X, Y and Z directions in FIGS. 2-20 are perpendicular to one another and are used consistently among the figures. Throughout the present disclosure, like reference numerals denote like features, unless otherwise excepted.

Figure 2:
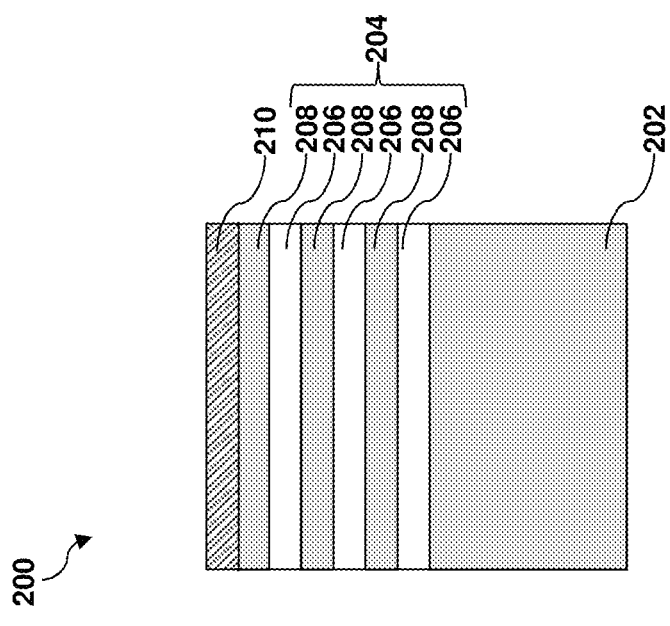
FIGS. 2-20 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is provided. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenic (As). In embodiments where the semiconductor device is n-type, a p-type doping profile (i.e., a p-type well or p-well) may be formed on the substrate 202. In some implementations, the p-type dopant for forming the p-type well may include boron (B) or gallium (Ga). The suitable doping may include ion implantation of dopants and/or diffusion processes. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

The workpiece 200 further includes a stack 204. In some embodiments represented in FIG. 2, the stack 204 includes sacrificial layers 206 of a first semiconductor composition interleaved by channel layers 208 of a second semiconductor composition. The first and second semiconductor composition may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness between about 9 nm and about 10 nm and all of the channel layers 208 may have a substantially uniform second thickness between about 6 nm and about 8 nm. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel region(s) for a subsequently-formed multi-gate device and the thickness of each of the sacrificial layers 206 is chosen based on device performance considerations.

The layers in the stack 204 may be deposited using a molecular beam epitaxy (MBE) process, a vapor phase deposition (VPE) process, and/or other suitable epitaxial growth processes at a temperature between about 600° C. and about 800° C. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth processes for the stack 204.

Figure 3:
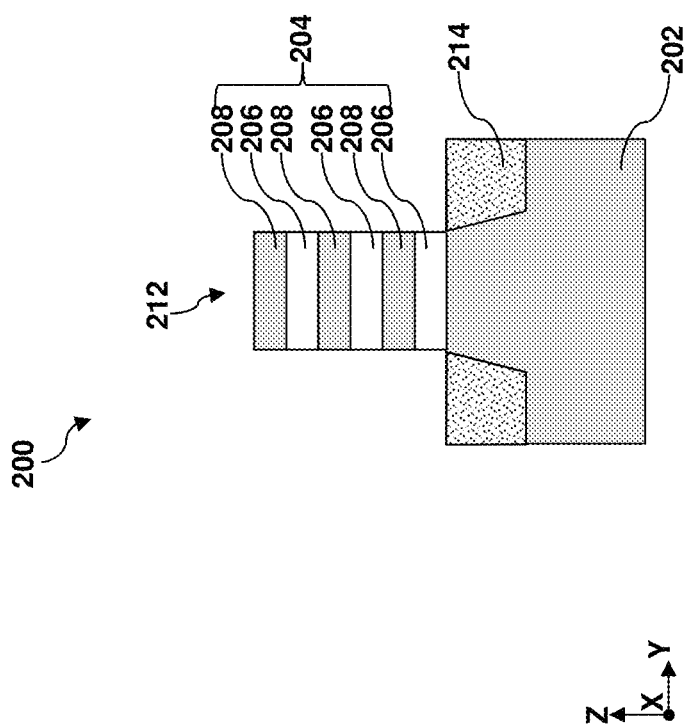

Referring still to FIGS. 1 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212, along with the sacrificial layers 206 and the channel layers 208 therein, extends vertically along the Z direction and lengthwise along the X direction.

An isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmosphere CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing.

Figure 4:
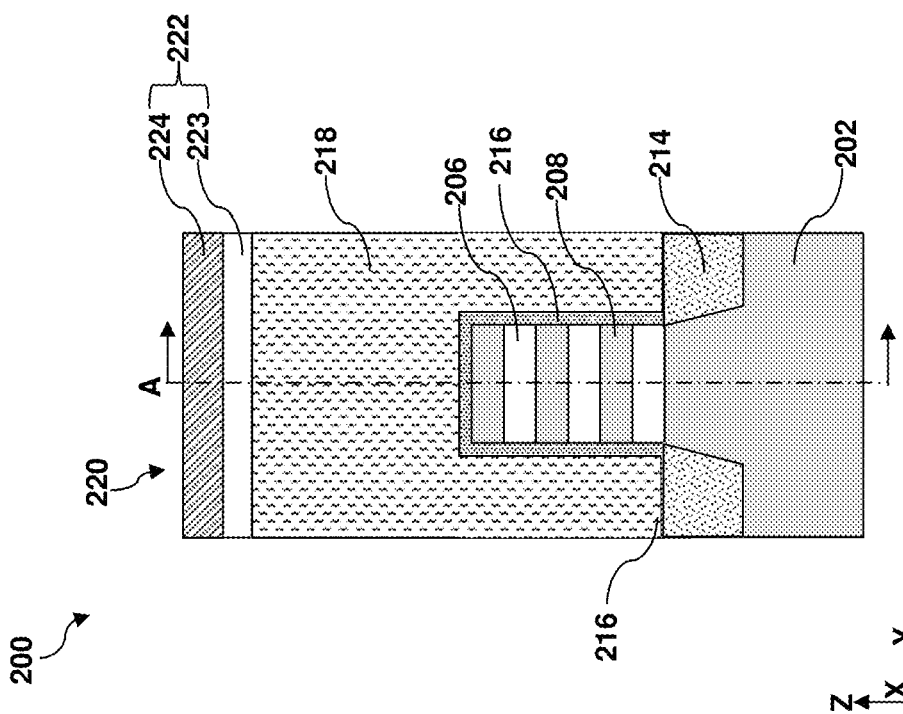
Figure 5:
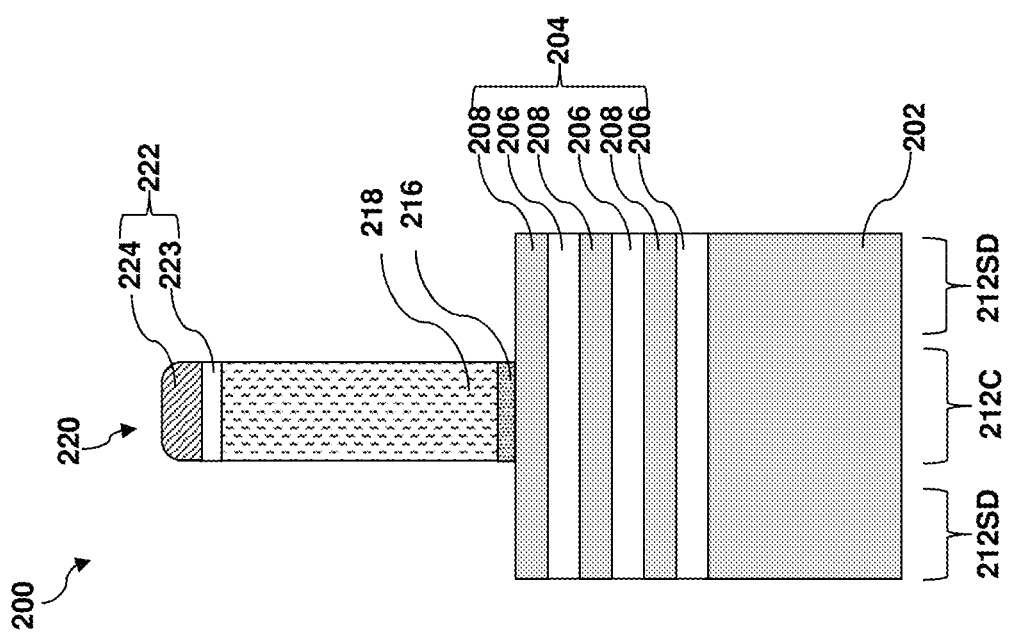

Referring to FIGS. 1, 4 and 5, method 100 includes a block 106 where a dummy gate stack 220 is formed over a channel region 212C of the fin-shaped structure 212. In some embodiments, a gate replacement process (or gate-last process) is adopted where the dummy gate stack 220 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be deposited over the workpiece 200. In some embodiments, the dummy dielectric layer 216 may be formed on the fin-shaped structure 212 using a chemical vapor deposition (CVD) process, an ALD process, an oxygen plasma oxidation process, a thermal oxidation process, or other suitable processes. In some instances, the dummy dielectric layer 216 may include silicon oxide. When the dummy dielectric layer 216 is formed using an oxidation process, it may be selectively formed on exposed surfaces of the fin-shaped structure 212, as illustrated in FIG. 4. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, no dummy gate stack 220 is disposed over the source/drain region 212SD of the fin-shaped structure 212.

Figure 6:
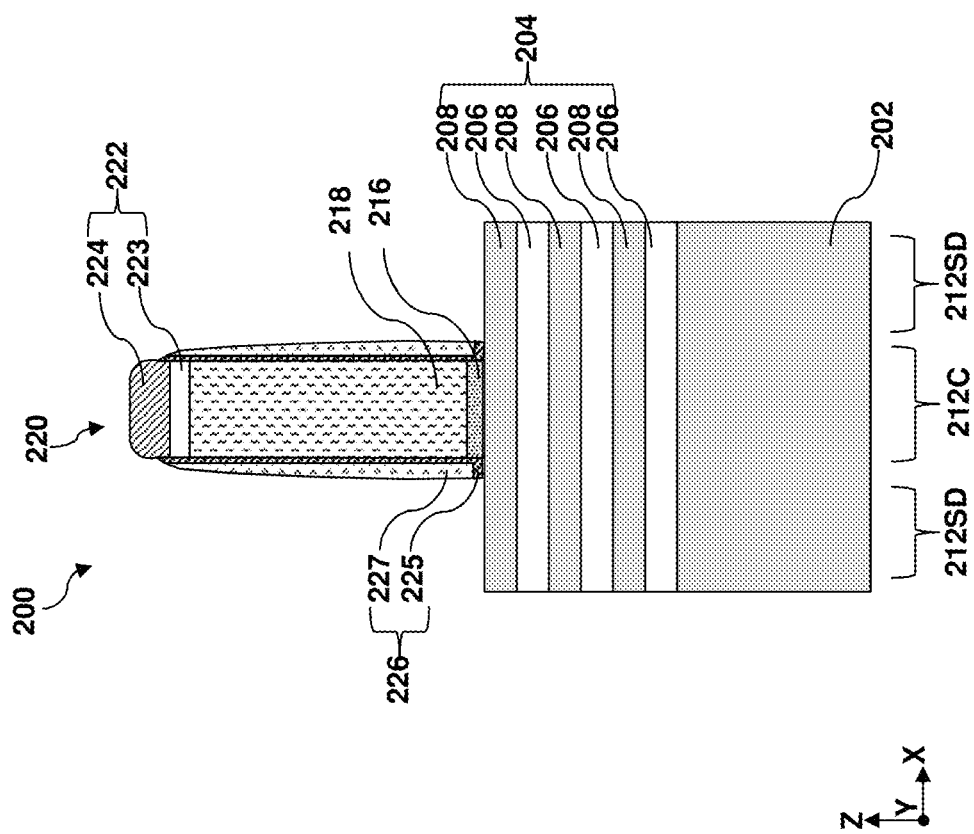

Referring to FIGS. 1 and 6, method 100 includes a block 108 where at least one gate spacer layer 226 is deposited over the dummy gate stack 220. In some embodiments, the at least one gate spacer layer 226 is deposited conformally over the workpiece 200, including over top surfaces and sidewalls of the dummy gate stack 220. The term "conformally" may be used herein for ease of description of a layer having substantially uniform thickness over various regions. The at least one gate spacer layer 226 may be a single layer or a multi-layer. In the depicted embodiments, the at least one gate spacer layer 226 includes a first spacer layer 225 and a second spacer layer 227 disposed over the first spacer layer 225. A composition of the first spacer layer 225 may be different from a composition of the second spacer layer 227. In some implementation, a dielectric constant of the first spacer layer 225 is greater than a dielectric constant of the second spacer layer 227. The at least one gate spacer layer 226, including the first spacer layer 225 and the second spacer layer 227, may include silicon oxide, silicon carbonitride, silicon oxycarbide, silicon oxycarbonitride, or silicon nitride. The at least one gate spacer layer 226 may be deposited over the dummy gate stack 220 using processes such as, a CVD process, a subatmospheric CVD (SACVD) process, an ALD process, or other suitable process. For ease of reference, the at least one gate spacer layer 226 may also be referred to the gate spacer layer 226 for simplicity.

Figure 7:
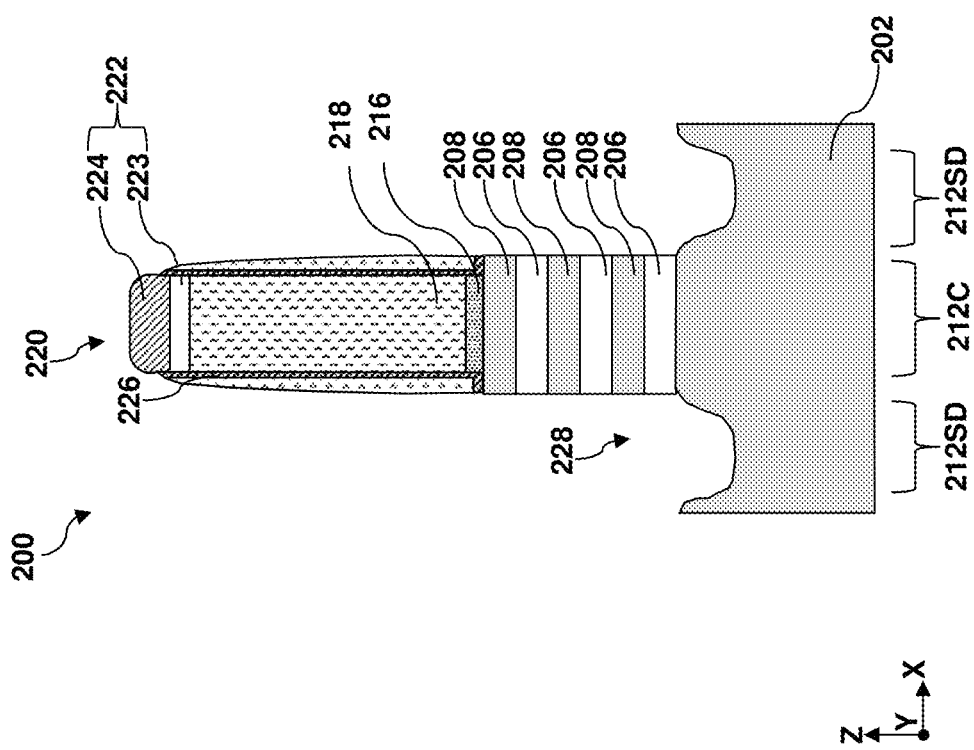

Referring to FIGS. 1 and 7, method 100 includes a block 110 where a source/drain region 212SD of the fin-shaped structure 212 is recessed to form a source/drain trench 228. In some embodiments, the source/drain regions 212SD that are not covered by the dummy gate stack 220 and the gate spacer layer 226 are etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or CHBR3), an iodine-containing gas, other suitable gases and/or plasmas, and/or combinations thereof. In some embodiments represented in FIG. 7, the source/drain regions 212SD of the fin-shaped structure 212 are recessed to expose sidewalls of the sacrificial layers 206 and the channel layers 208. In some implementations, the source/drain trenches 228 extend below the stack 204 into the substrate 202. FIG. 7 illustrates a cross-sectional view of the workpiece 200 viewed along the Y direction at the source/drain region 212SD. As shown in FIG. 7, the sacrificial layers 206 and channel layers 208 in the source/drain region 212SD are removed at block 110, exposing the substrate 202.

Figure 8:
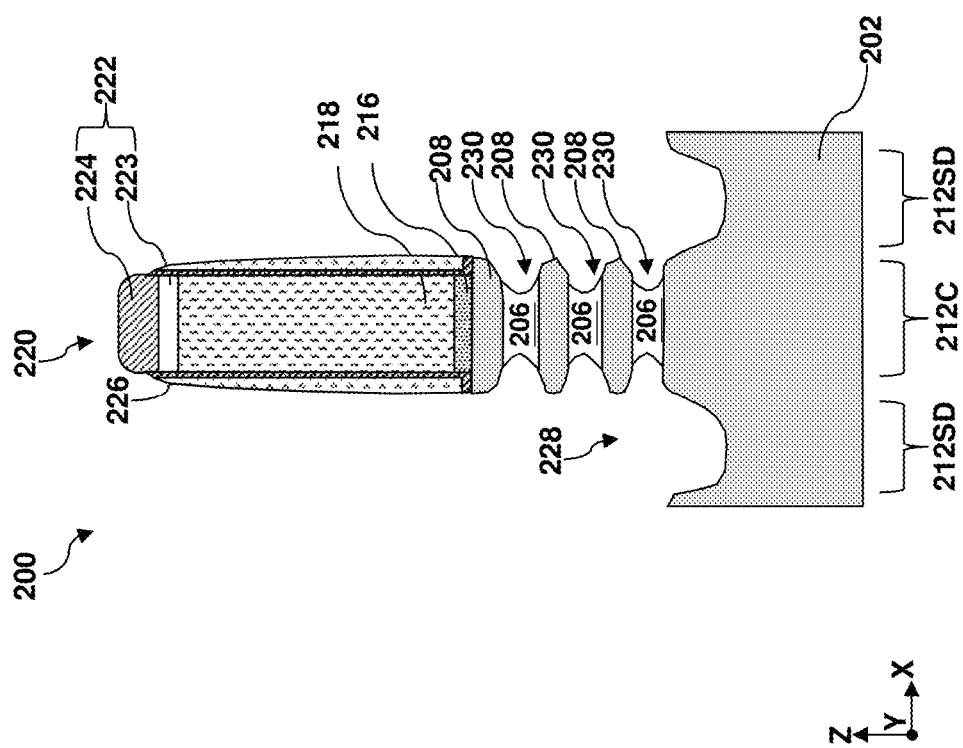

Referring to FIGS. 1 and 8, method 100 includes a block 112 where the sacrificial layers 206 are partially and selectively recessed to form inner spacer recesses 230. The sacrificial layers 206 exposed in the source/drain trenches 228 (shown in FIG. 8) are selectively and partially recessed to form inner spacer recesses 230 while the gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. The selective and partial recess of the sacrificial layers 206 may include a SiGe oxidation process followed by a SiGe oxide removal. In that embodiments, the SiGe oxidation process may include use of ozone. In some other embodiments, the selective dry etching process may include use of one or more fluorine-based etchants, such as fluorine gas or hydrofluorocarbons. The selective wet etching process may include an APM etch (e.g., ammonia hydroxide-hydrogen peroxide-water mixture). While the etch process at block 112 is selective, the exposed edge portions of the channel layers 208 may still be moderately etched or trimmed, as shown in FIG. 8.

Figure 9:
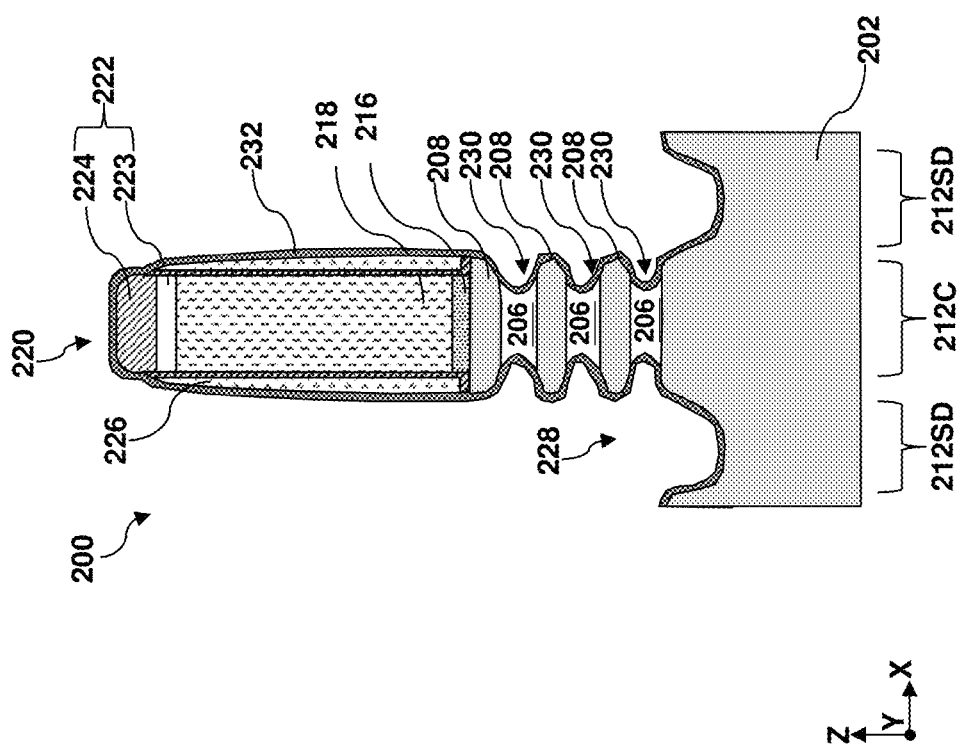
Figure 10:
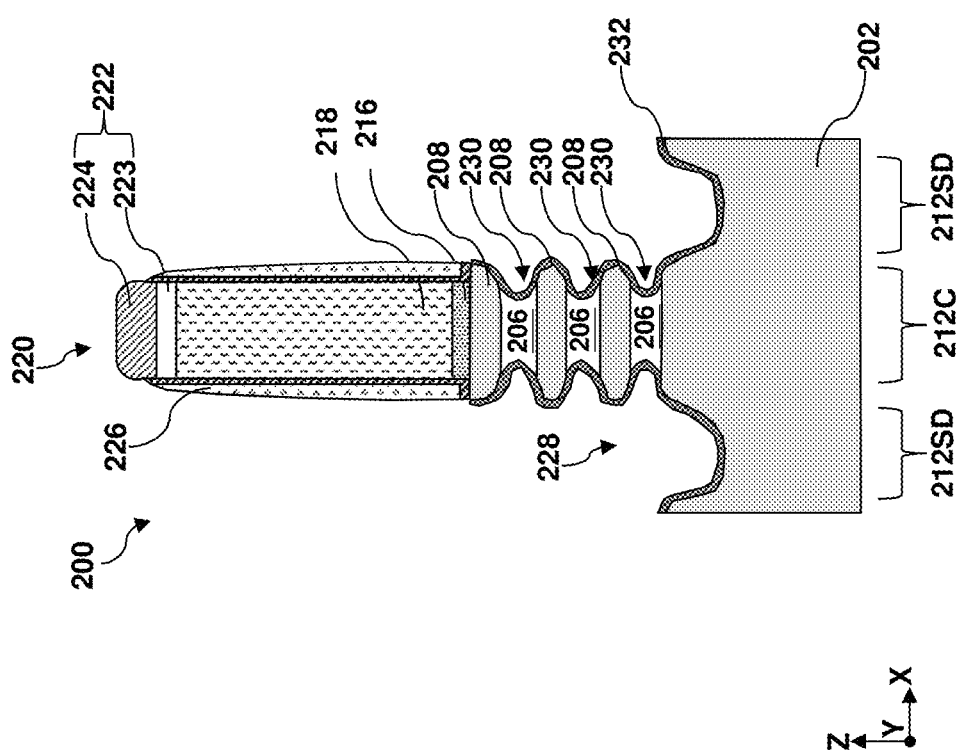

Referring to FIGS. 1, 9 and 10, method 100 includes a block 114 where a semiconductor liner 232 is deposited over the workpiece 200. In some embodiments, the semiconductor liner 232 is formed of a semiconductor material that is more etch-resistant than the sacrificial layers 206. The semiconductor liner 232 may include silicon (Si) or silicon-rich silicon germanium (SiGe). In the depicted embodiment, the semiconductor liner 232 may be formed of silicon (Si). The semiconductor liner 232 may be deposited over the workpiece 200 using an epitaxial deposition process, such as vapor-phase epitaxy (VPE), ultra-high vacuum CVD (UHV-CVD), molecular beam epitaxy (MBE), or a suitable epitaxy process. The epitaxial deposition process may or may not be selective to semiconductor materials. Referring to FIG. 9, when the epitaxial deposition process at block 114 implements a high process temperature between about 500° and 600° C., the deposition of the semiconductor liner 232 is not selective to the channel layers 208, the sacrificial layers 206, and the substrate 202. That is, the semiconductor liner 232 may be conformally deposited over the surfaces of the gate spacer layer 226 and the gate-top hard mask layer 222. Reference is now made to FIG. 10. When the epitaxial deposition process at block 114 implements a low process temperature between about 300° and 450° C., the deposition of the semiconductor liner 232 is selective to the channel layers 208, the sacrificial layers 206, and the substrate 202. That is, the semiconductor liner 232 is not substantially deposited on the surfaces of the gate spacer layer 226 and the gate-top hard mask layer 222. The semiconductor liner 232 may have a thickness between about 0.5 nm and about 3 nm. In some embodiments where the semiconductor device 200 include p-type MBC transistors, the semiconductor liner 232 may be doped with a p-type dopant, such as boron (B), to further increase etch resistance of the semiconductor liner 232 or to reduce parasitic resistance of the to-be-formed channel members.

While both the channel layers 208 and the semiconductor liner 232 may be formed of the same material, such as silicon (Si), the semiconductor liner 232 may be different from the channel layers 208 in terms of crystallinity and defect density. That is, an interface between the channel layers 208 and the semiconductor liner 232 is detectable. In some embodiments, the semiconductor liner 232 may have a lower crystallinity and a greater defect density that the channel layers 208. These differences may be explained by the different deposition temperatures and the different depth. The deposition temperature of the channel layers 208 in the stack 204 is greater than the deposition temperature of the semiconductor liner 232. Additionally, the channel layer 208 is allowed to grow to a greater thickness than the semiconductor liner 232. The greater thickness allows a more crystalline structure away from the growth interface.

Figure 11:
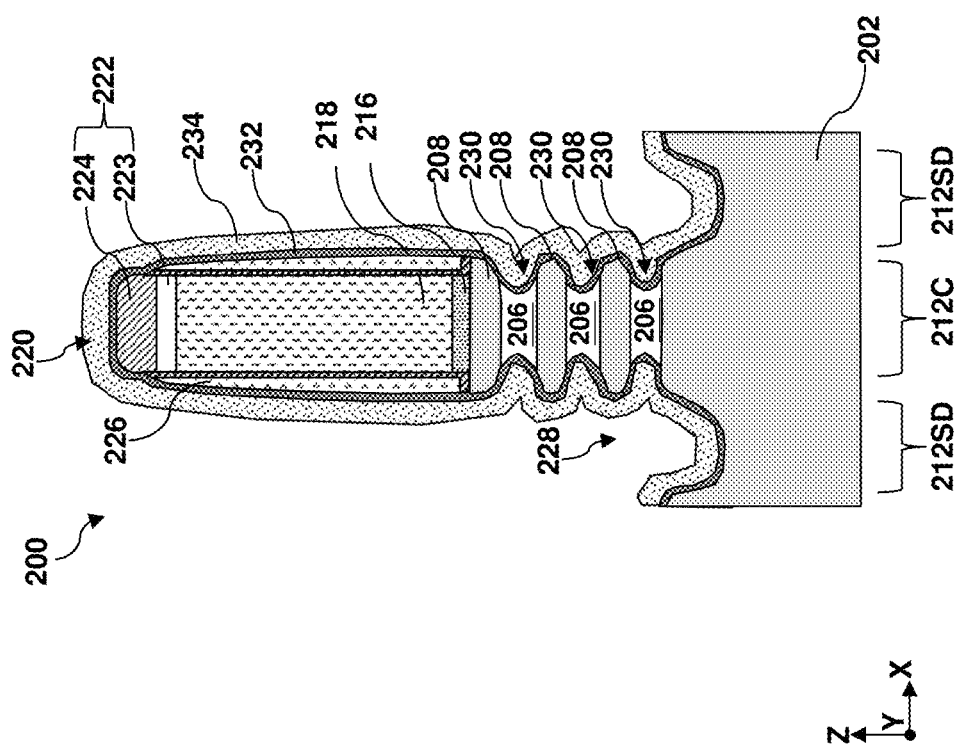
Figure 12:
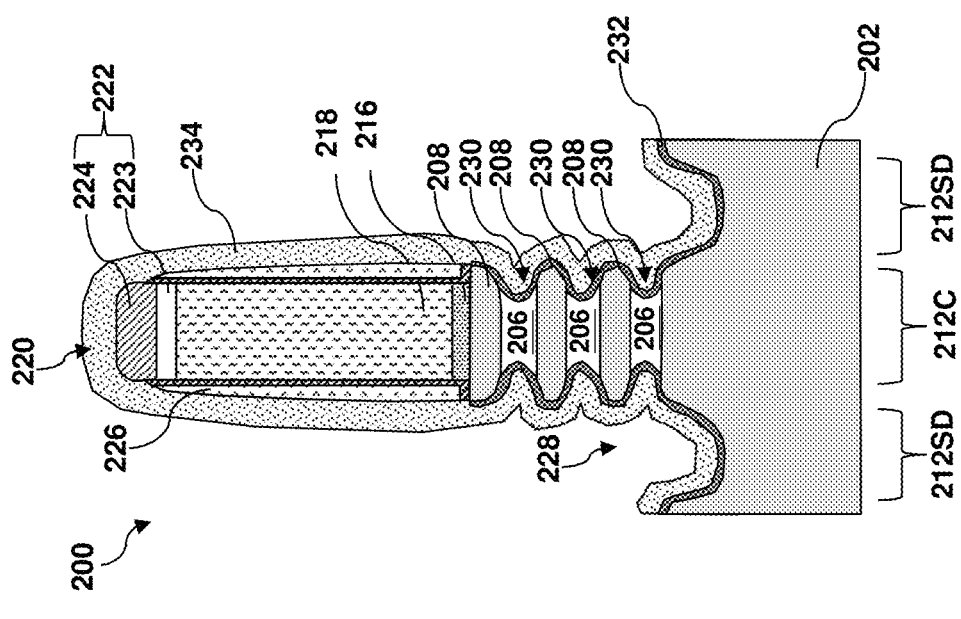

Referring to FIGS. 1, 11 and 12, method 100 includes a block 116 where an inner spacer layer 234 is deposited over the workpiece 200. After the semiconductor liner 232 is deposited over the workpiece 200, the inner spacer layer 234 is conformally deposited over the workpiece 200, including into the inner spacer recesses 230, as shown in FIG. 11 or 12. FIG. 11 illustrates the embodiments where the semiconductor liner 232 is selectively deposited on the channel layers 208, the sacrificial layers 206, and substrate 202. FIG. 12 illustrates the embodiments where the semiconductor liner 232 is blanketly deposited over the workpiece 200. The inner spacer layer 234 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer layer 234 may be a single layer or a multilayer. In some implementations, the inner spacer layer 234 may be deposited using CVD, PECVD, SACVD, ALD or other suitable methods. As shown in FIG. 11 or 12, the inner spacer layer 234 is also deposited over surfaces of the gate spacer layer 226 and the gate-top hard mask layer 222. It can be seen that the semiconductor liner 232 reduces the openings and volumes of the inner spacer recesses 230. Because the deposition of the inner spacer layer 234 may be conformal and the thickness of the inner spacer layer 234 may be substantially uniform, the reduction of openings and volumes of the inner spacer recesses 230 may reduce possibility of dishing profiles in the resulting inner spacer feature 236 (to be described below).

Figure 13:
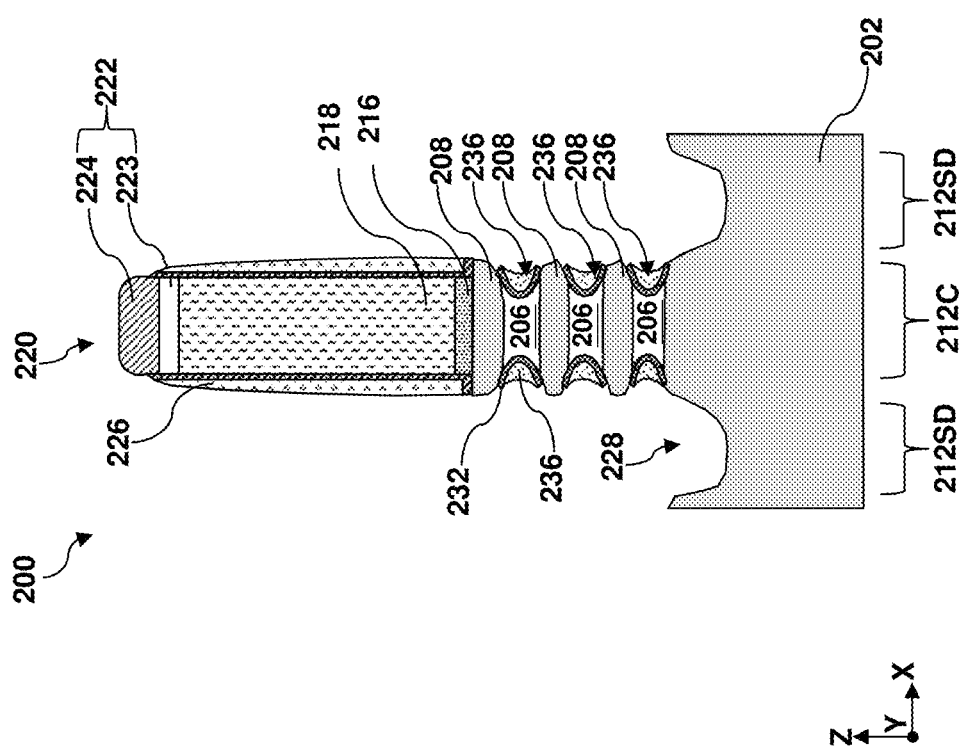

Referring to FIGS. 1 and 13, method 100 includes a block 118 where the semiconductor liner 232 and the inner spacer layer 234 are etched back to form inner spacer features 236. The deposited semiconductor liner 232 and inner spacer layer 234 are then etched back to remove the semiconductor liner 232 and the inner spacer layer 234 from the sidewalls of the channel layers 208 to form the inner spacer features 236 in the inner spacer recesses 230. In some implementations, the etch back operations performed at block 118 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 13, upon conclusion of the operations at block 118, each of the inner spacer features 236 is spaced apart from adjacent channel members 2080 and sacrificial layer 206 by the semiconductor liner 232. In this sense, the semiconductor liner 232 functions as a liner of the inner spacer feature 236 and may be referred to as the inner spacer liner 232. The semiconductor liner 232 is in direct contact with the channel layers 208, the sacrificial layers 206, and the inner spacer features 236. In some instances, each of the inner spacer features 236 measures between about 3 nm and about 5 nm think along the X direction. FIG. 13 also illustrates that the deposition of the semiconductor liner 232 reduces the volume of the inner spacer feature 236 in the inner spacer recess 230. While not explicitly shown, a cleaning process may be performed after the etch back process to remove native oxide and debris from surfaces of the channel layers 208.

Figure 14:
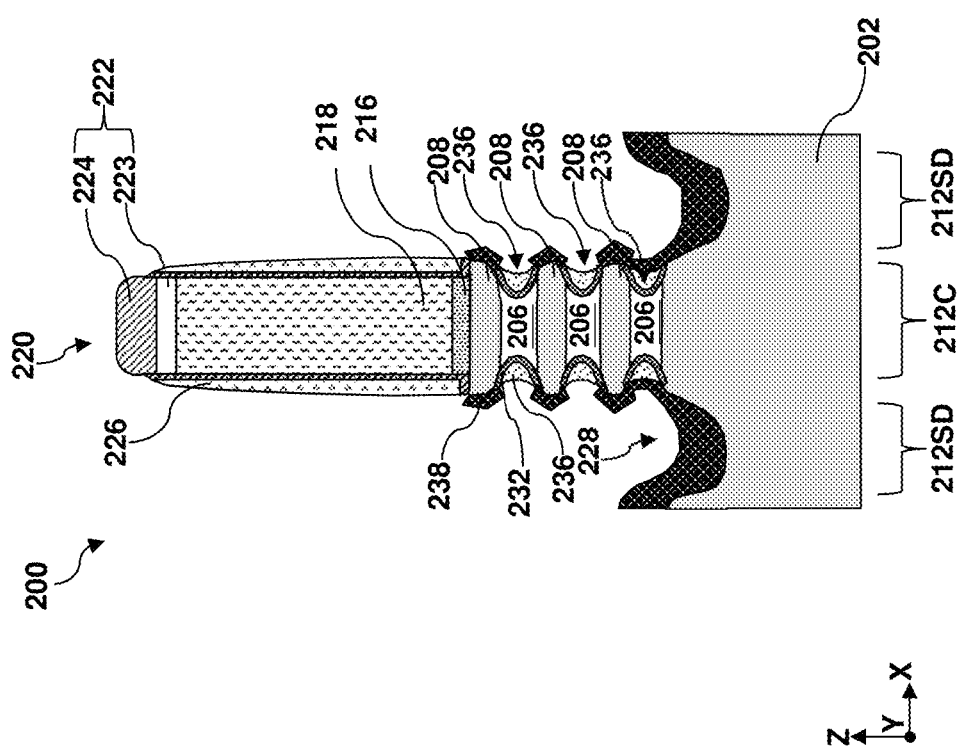

Referring to FIGS. 1 and 14, method 100 includes a block 120 where a first epitaxial layer 238 is deposited. In some implementations represented in FIG. 14, the first epitaxial layer 238 may be epitaxially and selectively formed from the exposed sidewalls of the channel layers 208, exposed surfaces of the semiconductor liner 232, and exposed surfaces of the substrate 202, while sidewalls of the sacrificial layers 206 remain covered by the inner spacer features 236 and the semiconductor liner 232. Suitable epitaxial processes for block 120 include vapor-phase epitaxy (VPE), ultra-high vacuum CVD (UHV-CVD), molecular beam epitaxy (MBE), and/or other suitable processes. The epitaxial growth process at block 120 may use gaseous precursors, which interact with the composition of the substrate 202, the channel layers 208, and the semiconductor liner 232. In some embodiments, parameters of the epitaxial growth process at block 120 are selected such that the first epitaxial layer 238 is not epitaxially deposited on the inner spacer features 236. That said, the overgrowth of the first epitaxial layer 238 may merge over some of the inner spacer feature 236. In the depicted embodiments, the bottommost inner spacer features 236 are covered by the first epitaxial layer 238. According to the present disclosure, upon conclusion of the operations at block 120, at least some inner spacer features 236 may remain exposed. That is, at least some inner spacer features 236 are not completely covered by the first epitaxial layer 238. Because the first epitaxial layer 238 is deposited on the semiconductor liner 232, the semiconductor liner 232 may be completely covered by the first epitaxial layer 238 and spaced apart from subsequent epitaxial layers.

In some embodiments represented in FIG. 14, the channel layers 208 are formed of silicon (Si) and end surfaces of each of the channel layers 208 include a (100) crystal plane. It is observed that the first epitaxial layer 238 deposited on such end surfaces has facets on the (111) plane or the (111) crystallographic orientation. As a result, when viewed along the Y direction (the lengthwise direction of the dummy gate stack 220), the first epitaxial layer 238 may have a diamond-like shape, a rhombus-like shape, or a portion thereof. The semiconductor liner 232 of the present disclosure may expand the growth end surfaces of the channel layers 208 and the resulting diamond-like or rhombus-like epitaxial layer 238 may be larger than it otherwise would be without implementation of the semiconductor liner 232.

Defects or voids in the first epitaxial layer 238 may lead to defects in further epitaxial layers to be deposited over the first epitaxial layer 238. As shown in FIG. 14, the semiconductor liner 232 may increase the areas of semiconductor surfaces and reduce the dielectric surface areas, thereby providing more epitaxial-growth-friendly surfaces for the deposition of the first epitaxial layer 238. Depending on the conductivity type of the MBC transistor on the semiconductor device 200 (such as the MBC transistor 280 shown in FIG. 20), the first epitaxial layer 238 may have different compositions. When the MBC transistor is n-type, the first epitaxial layer 238 may include silicon (Si) and may be doped with an n-type dopant, such as phosphorus (P) or arsenic (As). When the MBC transistor is p-type, the first epitaxial layer 238 may include silicon germanium (SiGe) and is doped with a p-type dopant, such as boron (B) or gallium (Ga).

Figure 15:
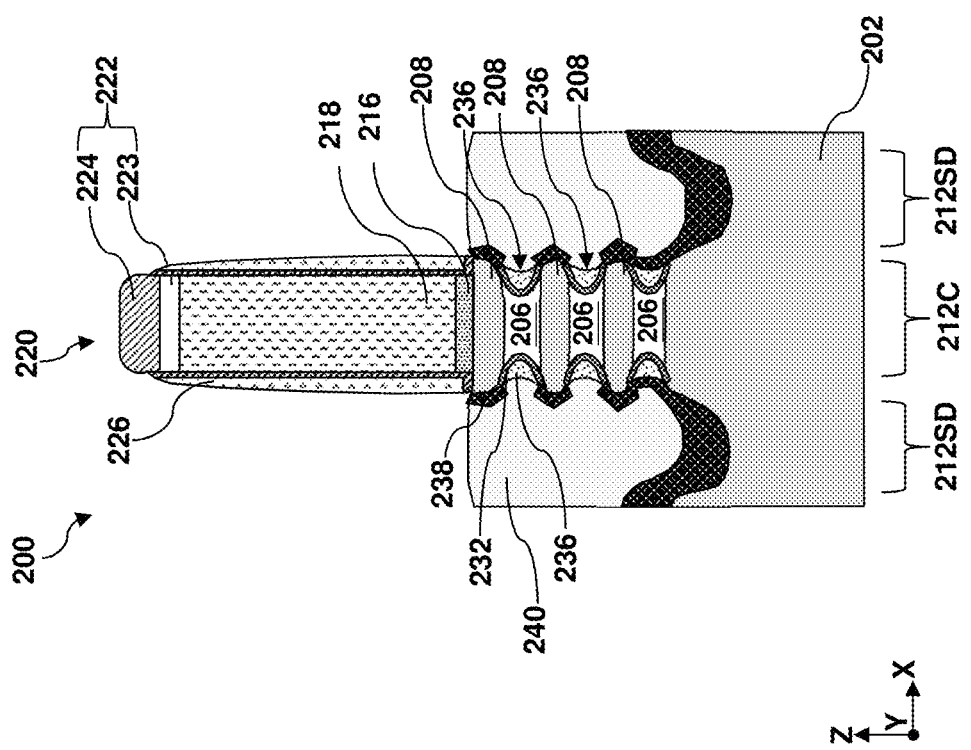

Referring to FIGS. 1 and 15, method 100 includes a block 122 where a second epitaxial layer 240 is deposited over the first epitaxial layer 238. In some embodiments, the second epitaxial layer 240 may be epitaxially and selectively formed from the first epitaxial layer 238. Suitable epitaxial processes for block 122 include vapor-phase epitaxy (VPE), ultra-high vacuum CVD (UHV-CVD), molecular beam epitaxy (MBE), and/or other suitable processes. The epitaxial growth process at block 122 may use gaseous precursors, which interact with the composition of the first epitaxial layer 238. The second epitaxial layer 240 is allowed to overgrow and merge over exposed inner spacer features 236 that is not already covered by the first epitaxial layer 238 and to substantially fill the source/drain trenches 228.

Depending on the conductivity type of the MBC transistor on the semiconductor device 200, the second epitaxial layer 240 may have different compositions. When the MBC transistor is n-type, the second epitaxial layer 240 may include silicon (Si) and may be doped with an n-type dopant, such as phosphorus (P) or arsenic (As). When the MBC transistor is p-type, the second epitaxial layer 240 may include silicon germanium (SiGe) and is doped with a p-type dopant, such as boron (B) or gallium (Ga). While the first epitaxial layer 238 and the second epitaxial layer 240 may be formed of similar semiconductor materials and doped with similar dopants, they have different compositions in terms of germanium content or dopant concentration. When the first epitaxial layer 238 and the second epitaxial layer 240 are n-type, both of them may be formed of silicon (Si) and the n-type dopant concentration in the second epitaxial layer 240 is greater than that in the first epitaxial layer 238. When the first epitaxial layer 238 and the second epitaxial layer 240 are p-type (i.e., formed of silicon germanium), the germanium content and the p-type dopant concentration in the second epitaxial layer 240 is greater than those in the first epitaxial layer 238. The greater dopant concentration in the second epitaxial layer 240 help reduces resistance. The greater germanium content in the second epitaxial layer 240 allows the second epitaxial layer 240 to strain the channel layers 208 (as well as the channel member formed therefrom) for improved hole mobility. The smaller germanium content in the first epitaxial layer 238 serves as a transitional layer between the germanium-free channel layers 208 and the second epitaxial layer 240 to reduce defects and contact resistance.

Figure 16:
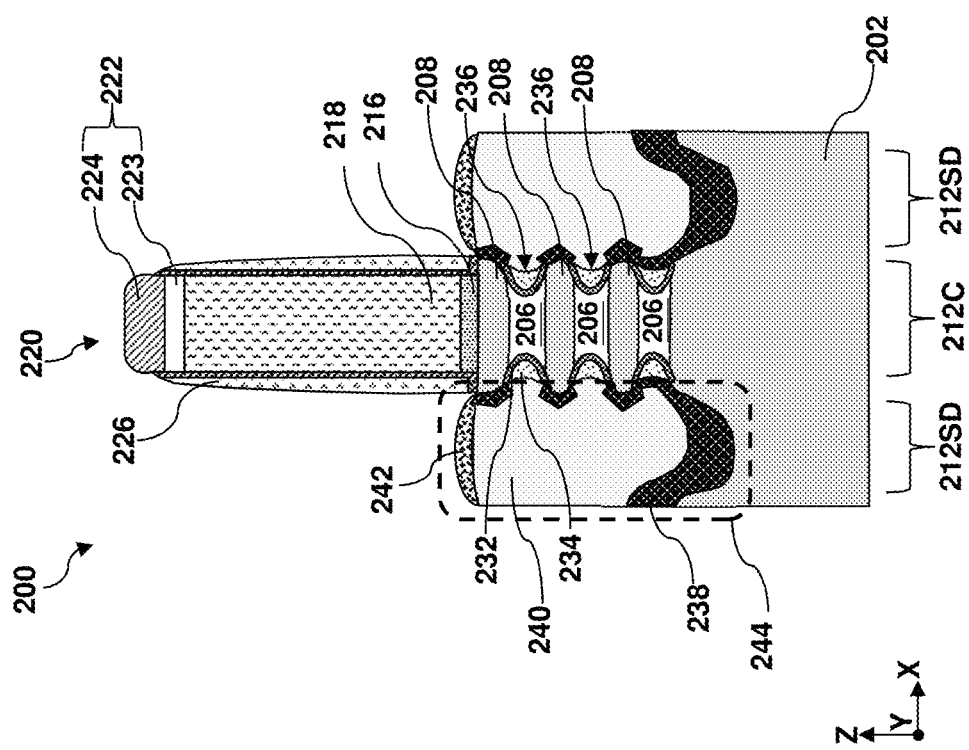

Referring to FIGS. 1 and 16, method 100 may include a block 124 where a third epitaxial layer 242 is deposited on the second epitaxial layer 240. In some embodiments, the third epitaxial layer 242 may be epitaxially and selectively formed from the second epitaxial layer 240. Suitable epitaxial processes for block 124 include vapor-phase epitaxy (VPE), ultra-high vacuum CVD (UHV-CVD), molecular beam epitaxy (MBE), and/or other suitable processes. The epitaxial growth process at block 124 may use gaseous precursors, which interact with the composition of the second epitaxial layer 240. Depending on the conductivity type of the MBC transistor on the semiconductor device 200, the third epitaxial layer 242 may have different compositions. When the MBC transistor is n-type, the third epitaxial layer 242 may include silicon (Si) and may be doped with an n-type dopant, such as phosphorus (P) or arsenic (As). When the MBC transistor is p-type, the third epitaxial layer 242 may include silicon germanium (SiGe) and is doped with a p-type dopant, such as boron (B) or gallium (Ga). While the third epitaxial layer 242 and the second epitaxial layer 240 may be formed of similar semiconductor materials and even doped with similar dopants, they have different compositions in terms of germanium content or dopant concentration. Because the third epitaxial layer 242 serves as an epitaxial capping layer to protect the second epitaxial layer 240, the third epitaxial layer 242 is more etch-resistant than the second epitaxial layer 240. In one embodiment where an n-type MBC transistor is desired, the third epitaxial layer 242 includes phosphorus-doped silicon (Si:P) and the phosphorus doping concentration in the third epitaxial layer 242 is smaller than that in the second epitaxial layer 240. This is so because experiments show that phosphorus dopant may accelerate etching. In another embodiment where a p-type MBC transistor is desired, the third epitaxial layer 242 includes boron-doped silicon germanium (SiGe:B) and the boron doping concentration in the third epitaxial layer 242 is smaller than that in the second epitaxial layer 240. This is so because experiments show that boron dopant in silicon germanium may slow down etching. The first epitaxial layer 238, the second epitaxial layer 240, and the third epitaxial layer 242 in one source/drain region 212SD may be collectively referred to as a source/drain feature 244 or an epitaxial source/drain feature 244.

In some implementation, the anneal process may be performed after the deposition of the third epitaxial layer 242. The anneal process may include a rapid thermal anneal (RTA) process, a laser spike anneal process, a flash anneal process, or a furnace anneal process. The anneal process may include a peak anneal temperature between about 900° C. and about 1000° C. In these implementations, the peak anneal temperature may be maintained for a duration measured by seconds or microseconds. Through the anneal process, a desired electronic contribution of the dopant in the semiconductor host, such as silicon germanium (SiGe) or silicon (Si), may be obtained. The anneal process may generate vacancies that facilitate movement of the dopants from interstitial sites to substitutional lattice sites and reduce damages or defects in the lattice of the semiconductor host.

Figure 17:
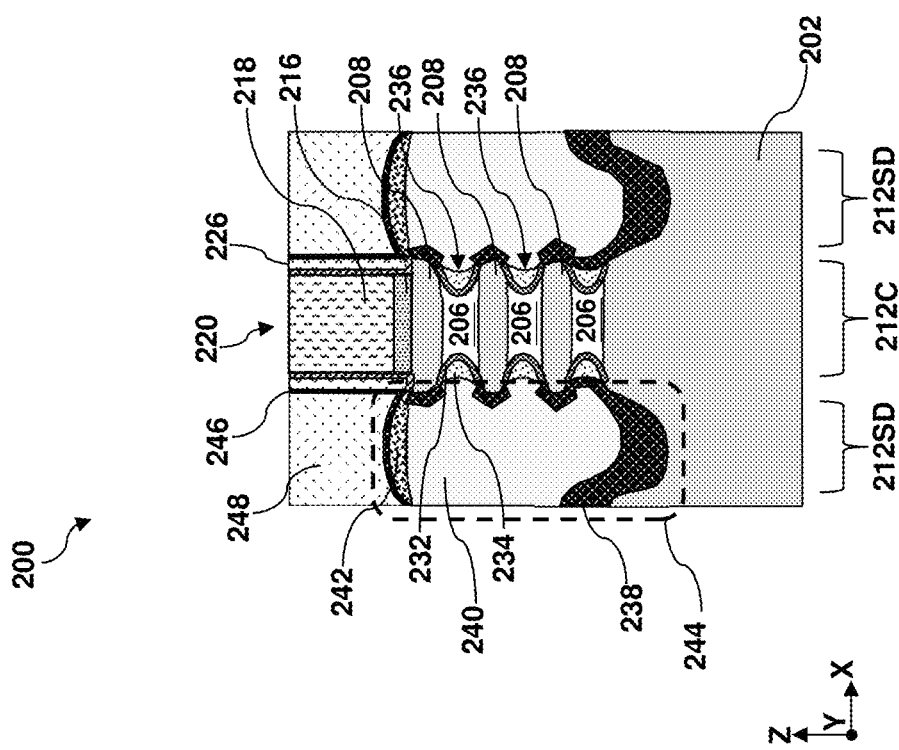

Referring to FIGS. 1 and 17-20, method 100 includes a block 126 where further processes are performed. Such further processes may include, for example, deposition of a contact etch stop layer (CESL) 246 over the workpiece 200 (shown in FIG. 17), deposition of an interlayer dielectric (ILD) layer 248 over the CESL 246 (shown in FIG. 17), removal of the dummy gate stack 220 (shown in FIG. 18), selective removal of the sacrificial layers 206 in the channel region 212C to release the channel layers 208 as channel members 2080 (shown in FIG. 19), and formation of a gate structure 260 over the channel region 212C (shown in FIG. 20). Referring now to FIGS. 17, the CESL 246 is formed prior to forming the ILD layer 248. In some examples, the CESL 246 includes silicon nitride, silicon oxynitride, and/or other materials known in the art. The CESL 246 may be formed by ALD, plasma-enhanced chemical vapor deposition (PECVD) process and/or other suitable deposition processes. The ILD layer 248 is then deposited over the CESL 246. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited by a PECVD process or other suitable deposition technique. In some embodiments, after formation of the ILD layer 248, the workpiece 200 may be annealed to improve integrity of the ILD layer 248. As shown in FIG. 17, the CESL 246 may be disposed directly on top surfaces of the third epitaxial layer 242.

Figure 18:
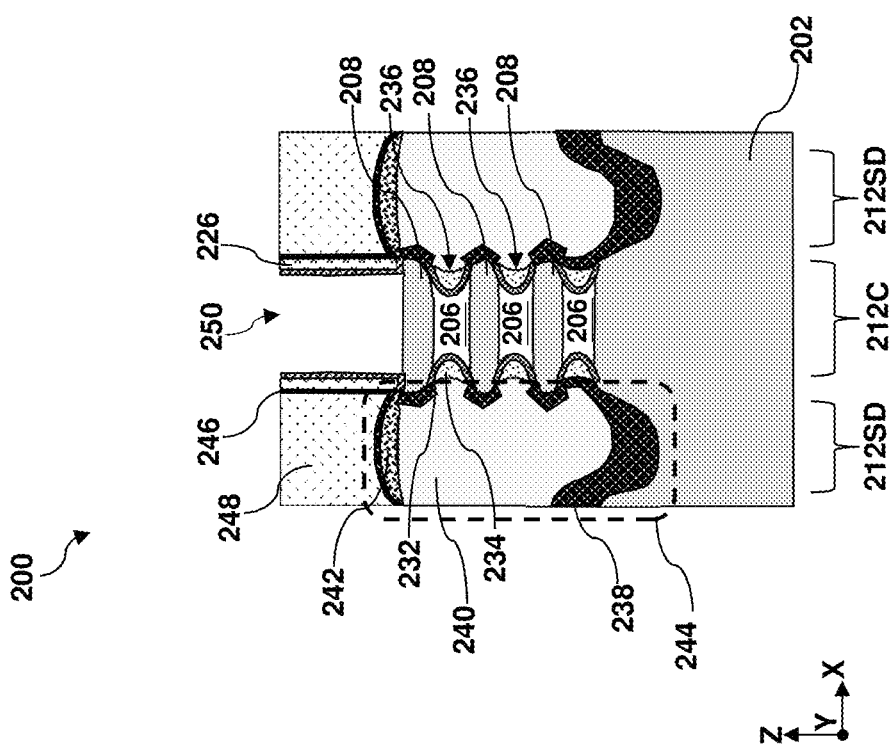

Referring still to FIG. 17, after the deposition of the CESL 246 and the ILD layer 248, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220 and release of the channel layers 208, illustrated in FIG. 19. The removal of the dummy gate stack 220 results in a gate trench 250 over the channel regions 212C, as shown in FIG. 18. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed in the gate trench 250.

Figure 19:
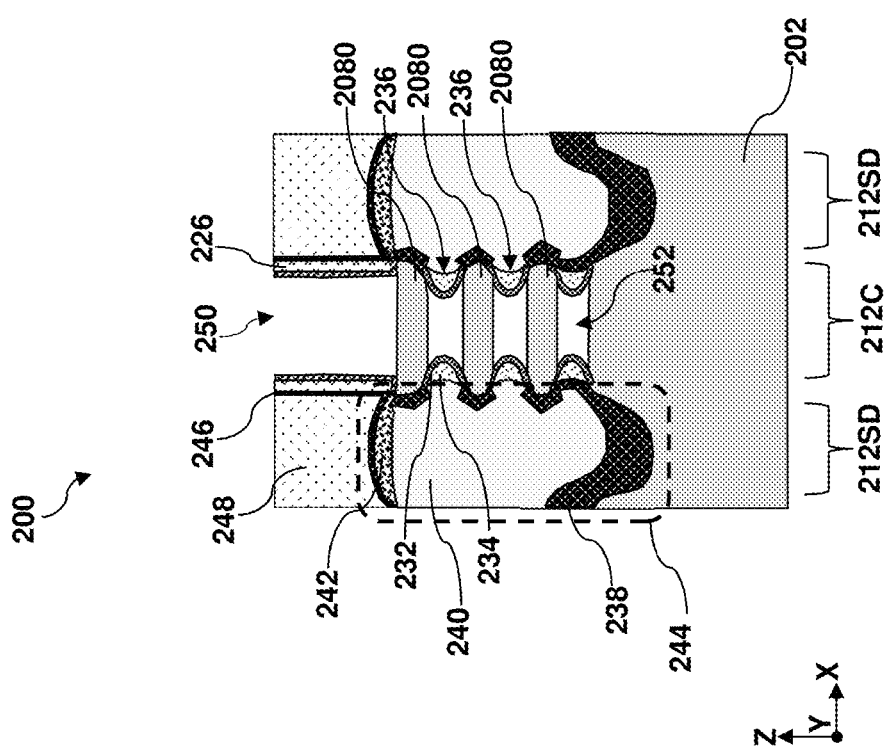

Referring to FIGS. 18 and 19, after the removal of the dummy gate stack 220, the method 100 may include operations to selectively remove the sacrificial layers 206 between the channel layers 208 in the channel region 212C. The selective removal of the sacrificial layers 206 releases the channel layers 208 in FIG. 18 to form channel members 2080 shown in FIG. 19. The selective removal of the sacrificial layers 206 also leaves behind space 252 between channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture). The selectively removal of the sacrificial layers 206 may be referred to as a channel release process. In some instances, the channel release process may partially or completely remove the semiconductor liner 232 exposed in the space 252.

Figure 20:
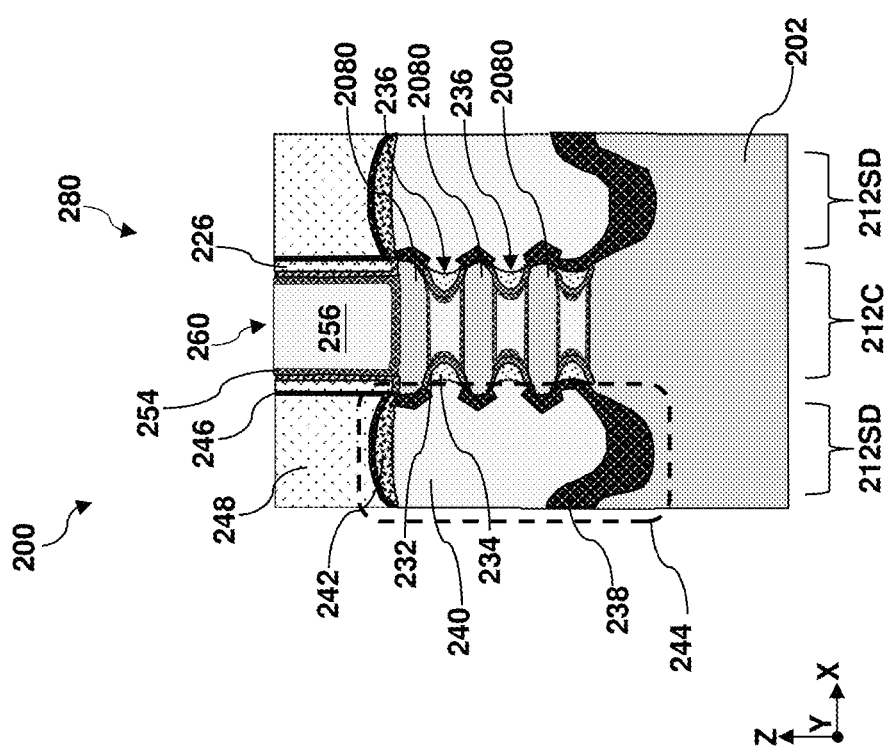

Referring to FIG. 20, the method 100 may include further operations to form the gate structure 260 to wrap around each of the channel members 2080. In some embodiments, the gate structure 260 is formed within the gate trench 250 and into the space 252 left behind by the removal of the sacrificial layers 206. In this regard, the gate structure 260 wraps around each of the channel members 2080. The gate structure 260 includes a gate dielectric layer 254 and a gate electrode layer 256 over the gate dielectric layer 254. In some embodiments, while not explicitly shown in the figures, the gate dielectric layer 254 includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer 256 of the gate structure 260 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 256 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a CMP process may be performed to remove excessive metal, thereby providing a substantially planar top surface of the gate structure 260. The gate structure 260 includes portions that interpose between channel members 2080 in the channel region 212C.

Reference is made to FIG. 20. Upon conclusion of the operations at block 126, an MBC transistor 280 is substantially formed. The MBC transistor 280 includes channel members 2080 that are vertically stacked along the Z direction. Each of the channel members 2080 is wrapped around by the gate structure 260. The channel members 2080 extend or are sandwiched between two source/drain features 244 along the X direction. Each of the source/drain features 244 includes the first epitaxial layer 238, the second epitaxial layer 240 over the first epitaxial layer 238, and the third epitaxial layer 242 over the second epitaxial layer 240. The first epitaxial layer 238 is in contact with the substrate 202, the channel members 2080, the semiconductor liner 232, and some of the inner spacer features 236. The second epitaxial layer 240 is in contact with the first epitaxial layer 238, the inner spacer features 236, and the third epitaxial layer 240. The second epitaxial layer 240 is spaced apart from the channel members 2080 by the first epitaxial layers 238. Additionally, the second epitaxial layer 240 is spaced apart from the semiconductor liner 232 by the first epitaxial layer 238 or the inner spacer feature 236. Because the semiconductor liner 232 is formed of a semiconductor material such as silicon (Si), it may serve as an extension or an area booster to improve the contact between the channel members 2080 and the source/drain features 244.

Although not intended to be limiting, one or more embodiments of the present disclosure provide many benefits to a semiconductor device and the formation thereof. For example, embodiments of the present disclosure provide an inner spacer liner that is formed of a semiconductor material. The inner spacer liner may facilitate formation of epitaxial source/drain features, improve contact between channel members and source/drain features, and prevent gate-source/drain shorting.

In one exemplary aspect, the present disclosure is directed to a semiconductor device. The semiconductor device includes a first source/drain feature and a second source/drain feature over a substrate, a plurality of channel members extending between the first source/drain feature and the second source/drain feature, a plurality of inner spacer features interleaving the plurality of channel members, a gate structure wrapping around each of the plurality of channel members, and a semiconductor liner sandwiched between the gate structure and each of the plurality of inner spacer features.

In some embodiments, the semiconductor liner is sandwiched between each of the plurality of inner spacer features and an adjacent channel member of the plurality of channel members. In some implementations, the semiconductor liner includes silicon (Si). In some instances, the first source/drain feature includes silicon (Si) and an n-type dopant. In some embodiments, the first source/drain feature includes silicon germanium (SiGe) and a p-type dopant. In some instances, the first source/drain feature includes a first epitaxial layer and a second epitaxial layer over the first epitaxial layer. The first epitaxial layer and the second epitaxial layer are doped with a dopant and a concentration of the dopant in the second epitaxial layer is greater than a concentration of the dopant in the first epitaxial layer. In some implementations, the first epitaxial layer is in contact with the semiconductor liner and the second epitaxial layer is spaced apart from the semiconductor liner.

In another exemplary aspect, the present disclosure is directed to a semiconductor structure. The semiconductor structure includes a first epitaxial feature and a second epitaxial feature, a plurality of nanostructures extending between the first epitaxial feature and the second epitaxial feature along a first direction, a plurality of inner spacer features interleaving the plurality of nanostructures, a gate structure wrapping around each of the plurality of nanostructures, and a silicon liner sandwiched between the gate structure and each of the plurality of inner spacer features. The silicon liner is in contact with the first epitaxial feature and the second epitaxial feature.

In some embodiments, the silicon liner is sandwiched between each of the plurality of inner spacer features and an adjacent nanostructure of the plurality of nanostructures. In some instances, the plurality of nanostructures are coupled together by the silicon liner. In some implementations, the first epitaxial feature includes a first epitaxial layer and a second epitaxial layer. The first epitaxial layer and the second epitaxial layer are doped with a dopant and a concentration of the dopant in the second epitaxial layer is greater than a concentration of the dopant in the first epitaxial layer. In some implementations, the first epitaxial layer is in contact with the silicon liner and the second epitaxial layer is spaced apart from the silicon liner. In some embodiments, the first epitaxial feature includes silicon (Si) and the dopant is an n-type dopant. In some instances, the first epitaxial feature includes silicon germanium (SiGe) and the dopant is a p-type dopant.

In yet another exemplary aspect, the present disclosure is directed to a method. The method includes forming a stack over a substrate, wherein the stack includes a plurality of silicon layers interleaved by a plurality of silicon germanium layers, forming a fin-shaped structure from the stack and the substrate, the fin-shaped structure including a channel region and a source/drain region, recessing the source/drain region to form a source/drain trench that exposes sidewalls of the plurality of silicon layers and the plurality of silicon germanium layers, selectively and partially recessing the plurality of silicon germanium layers to form a plurality of inner spacer recesses, depositing a semiconductor layer over the plurality of inner spacer recesses, depositing an inner spacer layer over the semiconductor layer, etching back the semiconductor layer and the inner spacer layer to form a plurality of inner spacer features in the plurality of inner spacer recesses, after the etching back, forming a source/drain feature in the source/drain trench, releasing the plurality of silicon layers in the channel region as a plurality of channel members, and forming a gate structure around each of the plurality of channel members.

In some embodiments, the depositing of the semiconductor layer includes epitaxially depositing a silicon layer. In some implementations, after the depositing of the semiconductor layer, the semiconductor layer in contact with the plurality of silicon germanium layers. In some instances, the forming of the source/drain feature includes depositing a first epitaxial layer and depositing a second epitaxial layer over the first epitaxial layer. In some embodiments, the depositing of the first epitaxial layer includes depositing the first epitaxial layer in contact with the silicon layers and the semiconductor layer. In some instances, the second epitaxial layer is spaced apart from the semiconductor layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first source/drain feature and a second source/drain feature over and in direct contact with a substrate;
a plurality of silicon nanostructures extending between the first source/drain feature and the second source/drain feature along a direction;
a plurality of inner spacer features interleaving the plurality of silicon nanostructures along a direction perpendicular to the substrate; and
a gate structure wrapping around each of the plurality of silicon nanostructures,
wherein each of the plurality of inner spacer features is spaced apart from the gate structure and the plurality of silicon nanostructures by a semiconductor liner,
wherein sidewalls of the plurality of silicon nanostructures are in direct contact with the first source/drain feature and the second source/drain feature.

2. The semiconductor device of claim 1, wherein the semiconductor liner comprises silicon.

3. The semiconductor device of claim 1, wherein the semiconductor liner is in direct contact with the first source/drain feature and the second source/drain feature.

4. The semiconductor device of claim 1, wherein the first source/drain feature comprises silicon (Si) and an n-type dopant.

5. The semiconductor device of claim 1, wherein the first source/drain feature comprises silicon germanium (SiGe) and a p-type dopant.

6. The semiconductor device of claim 1,
wherein the first source/drain feature comprises a first epitaxial layer and a second epitaxial layer over the first epitaxial layer,
wherein the first epitaxial layer and the second epitaxial layer are doped with a dopant,
wherein a concentration of the dopant in the second epitaxial layer is greater than a concentration of the dopant in the first epitaxial layer.

7. The semiconductor device of claim 6, wherein the second epitaxial layer is spaced apart from the semiconductor liner by the first epitaxial layer.

8. The semiconductor device of claim 6, wherein the second epitaxial layer is in contact with the plurality of inner spacer features.

9. The semiconductor device of claim 1, wherein the plurality of inner spacer features comprise silicon oxide, silicon oxycarbonitride, silicon nitride, silicon oxynitride, carbon-rich silicon carbonitride, aluminum oxide, zirconium oxide, tantalum oxide, yttrium oxide, titanium oxide, or lanthanum oxide.

10. A semiconductor structure, comprising:
a plurality of nanostructures disposed over a substrate;
a gate structure wrapping around each of the plurality of nanostructures;
a source/drain feature in direct contact with sidewalls of the plurality of nanostructures;
a plurality of inner spacer features interleaving the plurality of nanostructures; and
a silicon liner sandwiched between each of the plurality of inner spacer features and an adjacent one of the plurality of nanostructures,
wherein the silicon liner is in direct contact with the source/drain feature.

11. The semiconductor structure of claim 10, wherein the sidewalls of the plurality of nanostructures comprise a (100) crystal plane.

12. The semiconductor structure of claim 10, wherein a portion of the source/drain feature adjacent the sidewalls of the plurality of nanostructures comprise facets on a (111) crystal plane.

13. The semiconductor structure of claim 10, wherein the source/drain feature comprises:

a first epitaxial layer in contact with the substrate, the sidewalls of the plurality of nanostructures, and the silicon liner;

a second epitaxial layer spaced apart from the substrate, the sidewalls of the plurality of nanostructures, and the silicon liner by the first epitaxial layer; and a third epitaxial layer disposed on top surfaces of the first epitaxial layer and the second epitaxial layer.

14. The semiconductor structure of claim 13, wherein the second epitaxial layer is spaced apart from the silicon liner by the first epitaxial layer.

15. The semiconductor structure of claim 13, wherein the first epitaxial layer, the second epitaxial layer and the third epitaxial layer are doped with a dopant, wherein a concentration of the dopant in the second epitaxial layer is greater than a concentration of the dopant in the first epitaxial layer or a concentration of the dopant in the third epitaxial layer.

16. A method, comprising:

forming a stack over a substrate, wherein the stack comprises a plurality of silicon layers interleaved by a plurality of silicon germanium layers;

forming a fin-shaped structure from the stack and a portion of the substrate, the fin-shaped structure comprising a channel region and a source/drain region;

forming a dummy gate stack over the channel region;

recessing the source/drain region to form a source/drain trench that exposes sidewalls of the plurality of silicon layers and the plurality of silicon germanium layers in the channel region;

selectively and partially recessing the plurality of silicon germanium layers to form a plurality of inner spacer recesses;

depositing a semiconductor layer over the plurality of inner spacer recesses;

depositing an inner spacer layer over the semiconductor layer;

etching back the semiconductor layer and the inner spacer layer to form a plurality of inner spacer features in the plurality of inner spacer recesses;

after the etching back, forming a source/drain feature in the source/drain trench;

removing the dummy gate stack;

releasing the plurality of silicon layers in the channel region as a plurality of channel members; and forming a gate structure to wrap around each of the plurality of channel members.

17. The method of claim 16, wherein the depositing of the semiconductor layer comprises:

epitaxially depositing the semiconductor layer on sidewalls of the plurality of silicon layers, surfaces of the plurality of inner spacer recesses, and surfaces of the substrate in the source/drain region.

18. The method of claim 16, where the semiconductor layer comprises a silicon layer.

19. The method of claim 16, further comprising:

after the forming of the dummy gate stack, depositing at least one gate spacer layer along sidewalls of the dummy gate stack, wherein the at least one gate spacer layer comprises silicon oxide, silicon carbonitride, silicon oxycarbide, silicon oxycarbonitride, or silicon nitride.

20. The method of claim 16, wherein the forming of the source/drain feature comprises:

depositing a first epitaxial layer; and depositing a second epitaxial layer over the first epitaxial layer, wherein the first epitaxial layer is in contact with the plurality of silicon layers and the semiconductor layer, wherein the second epitaxial layer is spaced apart from the semiconductor layer.

* * * * *